(12) United States Patent
Bernard et al.

(10) Patent No.: US 6,422,823 B2
(45) Date of Patent: Jul. 23, 2002

(54) MINI-ENVIRONMENT CONTROL SYSTEM AND METHOD

(75) Inventors: Roland Bernard, Viuz-la-Chiesaz; Eric Chevalier, Annecy le Vieux, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/729,779

(22) Filed: Dec. 6, 2000

(30) Foreign Application Priority Data

Dec. 9, 1999 (FR) .............................................. 99 15528

(51) Int. Cl.[7] .......................... F04B 49/00; H01L 21/302
(52) U.S. Cl. .......................... 417/18; 438/689; 438/758; 414/217; 417/53
(58) Field of Search .......................... 417/53, 207, 244, 417/36, 411, 18; 156/345; 118/50; 313/552; 438/689, 758

(56) References Cited

U.S. PATENT DOCUMENTS

| | | | | |
|---|---|---|---|---|
| 4,636,128 A | * | 1/1987 | Millis et al. ................. | 414/217 |
| 4,664,578 A | * | 5/1987 | Kakehi ......................... | 414/217 |
| 4,676,884 A | * | 6/1987 | Dimock et al. ............. | 204/298 |
| 4,938,742 A | | 7/1990 | Smits .......................... | 604/67 |
| 4,966,519 A | * | 10/1990 | Davis et al. ................. | 414/786 |
| 4,969,556 A | | 11/1990 | Ishimaru et al. | |
| 5,180,288 A | * | 1/1993 | Richter et al. .............. | 417/48 |
| 5,255,783 A | | 10/1993 | Goodman et al. .......... | 206/334 |
| 5,295,522 A | * | 3/1994 | DeAngelis et al. ......... | 141/98 |
| 5,375,979 A | | 12/1994 | Trah ............................ | 417/52 |
| 5,377,476 A | * | 1/1995 | Bohmer et al. ............. | 53/255 |
| 5,382,127 A | * | 1/1995 | Garric et al. ............... | 414/217 |
| 5,549,205 A | * | 8/1996 | Doche ........................ | 206/617 |
| 5,810,537 A | * | 9/1998 | Briner et al. ................ | 414/217 |
| 5,871,336 A | | 2/1999 | Young ......................... | 417/207 |
| 5,975,856 A | | 11/1999 | Welle .......................... | 417/53 |
| 5,988,233 A | | 11/1999 | Fosnsight et al. .......... | 141/63 |
| 6,176,023 B1 | * | 1/2001 | Doche ......................... | 34/451 |
| 6,261,066 B1 | * | 7/2001 | Linnemann et al. ........ | 417/53 |
| 2001/0014286 A1 | * | 8/2001 | Peters et al. ................ | 417/53 |

FOREIGN PATENT DOCUMENTS

| | | |
|---|---|---|
| EP | 0 582 018 A1 | 2/1994 |
| EP | 0 854 498 A1 | 7/1998 |

OTHER PUBLICATIONS

Tracy, Thermomolecular Pumping Effect, 1974, J. of Physics E. Scientific Instruments vol. 7, pp. 533–536.*

Orner et al, The Application of Thermal Transpiration to a Gaseous Pump, 1970, Trans. ASME J. of Basic Engineering, Jun. 1970, pp. 294–302.*

* cited by examiner

Primary Examiner—Charles G. Freay
Assistant Examiner—Han L Liu
(74) Attorney, Agent, or Firm—Sughrue Mion, PLLC

(57) ABSTRACT

A mini-environment control device includes an individual enclosure to contain a sample and to isolate it from the external environment. An array of micropumps attached to the individual enclosure generates and maintains a controlled vacuum in the individual enclosure. Transfer means introduce the sample into the individual enclosure and extract it therefrom. The micropumps of the array of micropumps can be of a type employing the thermal transpiration effect. Temperature and pressure microsensors and a gas analyzer enable the operation of the array of micropumps to be controlled by an onboard microcomputer. The atmosphere surrounding a sample is therefore controlled.

16 Claims, 2 Drawing Sheets

MINI-ENVIRONMENT CONTROL SYSTEM AND METHOD

BACKGROUND OF THE INVENTION

1. Field of the Invention

The present invention relates to devices and methods for controlling the atmosphere surrounding a sample such as a substrate wafer for fabricating semiconductors, for example, or any other item, during testing or manufacture.

2. Description of the Prior Art

In the semiconductor industry, for example, substrate handling systems are currently used to isolate the substrates from contaminating agents in white rooms. Several substrates are placed in a common collective box containing nitrogen or another neutral gas under pressure, as taught in the documents EP 0 582 018 A or U.S. Pat. No. 5,988,233 A. The atmosphere in the box is not controlled. The presence of the nitrogen or other neutral gas, which requires a transient step of degassing before vacuum treatment of the substrate, in an interface like that described in the same document EP 0 582 018 A, constitutes a problem. Another problem is the contamination resulting from gas flows during return to the treatment pressure, as a result of which a purge device like that described in the document U.S. Pat. No. 5,988,233 A may be provided.

In the documents U.S. Pat. No. 5,255,783 A and EP 0 854 498 A, several substrates can be transported in a common collective box, the atmosphere in which is at a reduced pressure established by an external source and which can contain a substitute neutral gas. The atmosphere of the box is not controlled. At the very most, the document EP 0 854 498 A teaches continuous agitation and filtering of the internal atmosphere, and the generation of an internal overpressure on opening the access door. All the above documents encourage collective transportation of the samples by grouping several of them in a common collective box.

Various micropump designs are known in the art, including thermal transpiration micropumps described in the document U.S. Pat. No. 5,871,336 A when applied to generating vacuum in a miniature gas analyzer employing a mass spectrograph or other miniature sensor ; thermal gas expansion micropumps described in the document U.S. Pat. No. 5,375,979 A; piezo-electric membrane micropumps described in the document U.S. Pat. No. 4,938,742 A for pumping liquids or gases in the fields of medication, biology, cooling and fuel supply ; micropumps which function by varying the volume of gases using Peltier-effect junctions described in the document U.S. Pat. No. 5,975,856 A when applied to acceleration, pressure or chemical composition sensors or to fluid control in the pharmaceutical or aerospace industry. None of the above documents describes or suggests an application to controlling the atmosphere in the treatment of samples such as semiconductor wafers.

An object of the invention is to design a device for placing the sample in a controlled atmosphere, and maintaining it therein, which is as close as possible to the conditions under which the sample is treated or used, and to eliminate or significantly reduce transient steps of atmosphere modification and adaptation that have previously been necessary between successive sample treatment or test operations.

The invention aims to bring the sample as close as possible to the conditions of use or treatment and to maintain it there.

SUMMARY OF THE INVENTION

To this end, the invention provides a method of testing samples or of transforming samples by etching and deposition, said method including a step of transporting the sample individually in a controlled vacuum in an individual enclosure. This significantly reduces the risk of contaminating the samples.

The size of the individual enclosure is preferably only slightly greater than that of the sample to be transported, so that the sample placed in the enclosure is surrounded by a small volume of atmosphere constituting a mini-environment.

The invention also provides a device for controlling the atmosphere which surrounds a sample, notably for using these methods, said device including:

a sealed individual enclosure conformed to contain said sample and to isolate it from the external atmosphere with a small volume interior atmosphere around said sample, an array of micropumps fastened to said individual enclosure and adapted to generate and maintain a controlled vacuum in said individual enclosure, said array of micropumps being adapted to be connected to an electrical power supply, transfer means for introducing said sample into said individual enclosure and extracting it therefrom.

The above device produces a mini-environment around the sample, significantly reducing the risk of contamination of the sample.

In a first embodiment, the combination of said individual enclosure and said array of micropumps constitutes a portable self-contained system including an internal electrical power supply for supplying power at least temporarily to said array of micropumps. It is therefore possible to move the sample between two successive workstations without necessitating any transient degassing operation such as has been necessary with pressurized nitrogen containers.

In another application, said combination of said individual enclosure and said array of micropumps is fixed and constitutes a transfer chamber in a semiconductor fabrication installation.

According to one advantageous facility, in particular for constituting a portable self-contained system, said array of micropumps comprises thermal transpiration micropumps. The heat sources for producing the thermal transpiration effect can be electrical resistances or Peltier-effect junctions. An advantage of these micropumps is that they have no moving parts, and therefore no parts that can be worn by friction. This can therefore achieve excellent reliability, and freedom from losses caused by friction.

Also, these micropumps do not release unwanted particles into the atmosphere.

Micromembrane micropumps, piezo-electric micropumps or gas thermal expansion micropumps in which the gases can be heated by electrical resistances or by Peltier-effect junctions can be used instead.

The interior atmosphere can be controlled by temperature and pressure microsensors and a gas analyzer controlling the micropumps via an onboard microcomputer.

Other objects, features and advantages of the present invention will emerge from the following description of particular embodiments, which is given with reference to the accompanying drawings.

DETAILED DESCRIPTION OF THE PREFERRED EMBODIMENTS

Figure 2:
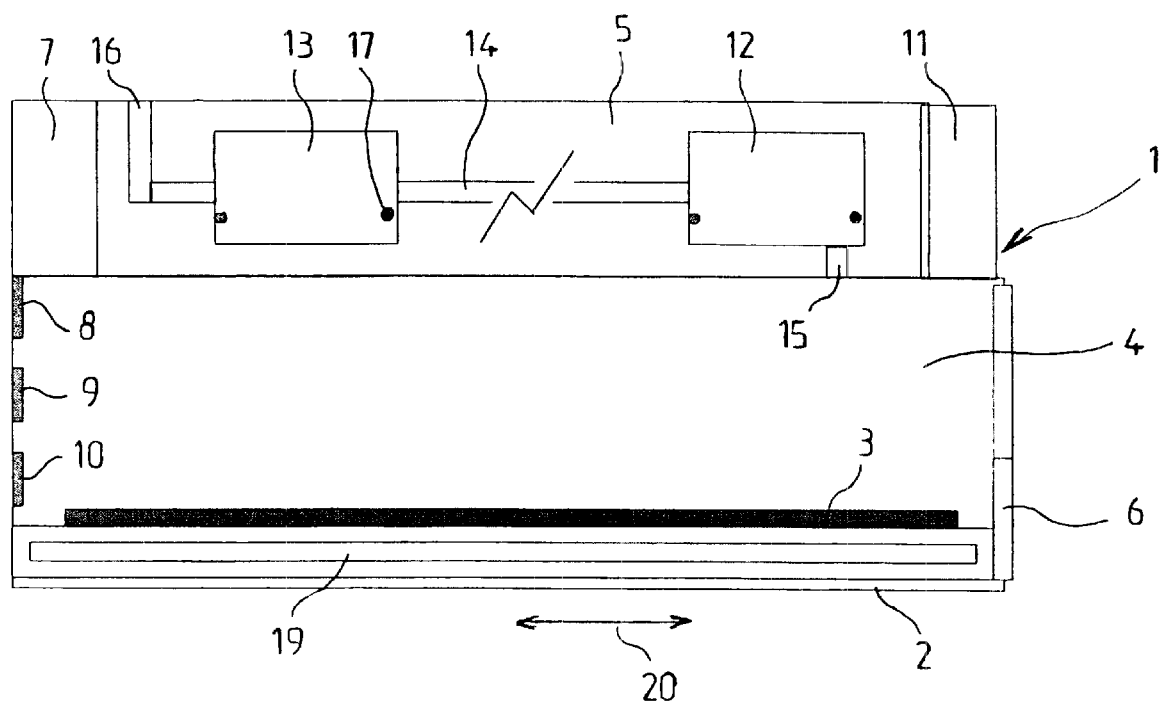
FIG. 2 is a diagrammatic view in section of an embodiment of an atmosphere control device in accordance with the present invention.

Referring more particularly to FIG. 2, a device in accordance with the invention for controlling the atmosphere in a mini-environment includes an individual enclosure 1 with a sealed peripheral wall 2 conformed to contain a sample 3 and to isolate it from the external atmosphere with a small volume 4 around the sample 3 inside the individual enclosure 1. For a semiconductor substrate wafer, for example, the peripheral wall 2 can define a flat parallelepiped-shaped interior chamber whose dimensions are only slightly greater than those of the substrate wafer.

An array of micropumps 5, attached to the individual enclosure 1, is adapted to generate and maintain a controlled vacuum in the individual enclosure 1. The array of micropumps 5 can be connected to an electrical power supply.

Transfer means shown diagrammatically as a door 6 and a transfer plate 19, which can be motorized and slides longitudinally as shown by the double-headed arrow 20, insert the sample 3 in the individual enclosure 1 or extract it therefrom.

In the FIG. 2 embodiment, the combination of the individual enclosure 1 and the array of micropumps 5 is a portable self-contained system including an internal electrical power supply 7 for supplying power at least temporarily to the array of micropumps 5 and its control units. A portable configuration of the device as a whole can have a diameter of approximately 200 mm to approximately 500 mm, and a thickness from approximately 30 mm to approximately 50 mm.

In the FIG. 2 embodiment, the device further includes microsensors such as, for example, a temperature microsensor 8, a pressure microsensor 9, and a gas analyzer 10, for controlling the atmosphere in the individual enclosure 1 and for controlling the array of micropumps 5 via an onboard microcomputer 11. The microcomputer 11 is programmed to control the operation of the micropumps 5 to stabilize the atmosphere in the individual enclosure 1 around the sample 3.

Figure 1:
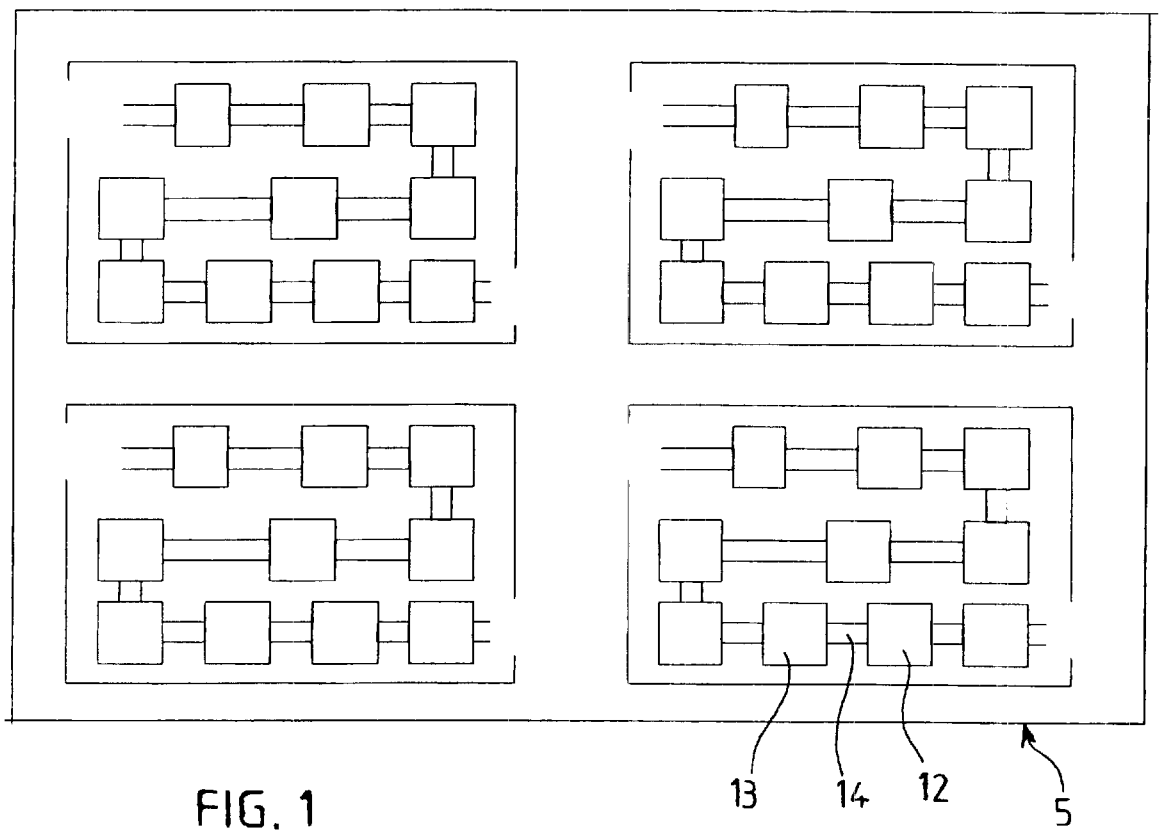
FIG. 1 is a diagram showing in section an array of thermal transpiration micropumps that can be used in accordance with the present invention.

In the embodiment shown in FIG. 1, the array of micropumps 5 comprises micropumps operating by the thermal transpiration effect. As demonstrated by Knudsen, thermal transpiration establishes a pressure difference between two large volumes at different temperatures linked by a channel with very small transverse dimensions, the radius of which is less than the mean free path of the molecules. A succession of channels and volumes can therefore generate a pressure difference from atmospheric pressure down to a hard vacuum.

Considering two successive chambers 12 and 13 connected by a small-section channel 14, for example, as shown in FIG. 1, if the second chamber 13 is at a higher temperature than the first chamber 12, for example with a first chamber 12 at 300° K. and a second chamber 13 at 600° K., the pressure in the second chamber 13 can be 1.4 times greater than the pressure in the first chamber 12. The ratio of the pressures is substantially proportional to the square root of the ratio of the absolute temperatures in the two chambers 12 and 13.

This effect is produced even if the channel 14 is short but sufficiently long to maintain the temperature difference between the two chambers 12 and 13.

Clearly a plurality of chambers linked by a plurality of channels can be provided.

Accordingly, the array of micropumps 5 can advantageously comprise a succession of chambers 12, 13 connected by channels 14 of which at least one transverse dimension is approximately equal to or less than the mean free path of the gas molecules present in the micropumps 5, and with means for creating and maintaining a temperature difference between the successive chambers 12, 13 in order to generate a pumping effect.

This plurality of chambers and channels can be formed on substrates by micromachining processes routinely used in microtechnology. Multiple sequences (thousands of sequences) can then be performed on an entire wafer, which significantly increases the pumping capacity of the array, which can be as high as several hundred mbar.L/s, with nominal and redundant sequences. It is important to note that there are no moving parts.

In an array of micropumps 5 of this kind using the thermal transpiration effect it is necessary to create and to maintain a temperature difference between the successive chambers such as the chambers 12 and 13 in order to generate a pumping effect.

As shown to a larger scale in FIG. 2, an array of thermal transpiration micropumps 5 according to the invention can include a pump inlet 15 connected to the interior volume 4 of the individual enclosure 1 and a pump outlet 16 connected to atmospheric pressure. The array of micropumps 5 receives a gas at a low pressure via its inlet 15 and exhausts the gas at atmospheric pressure via its outlet 16.

Each of the connecting channels such as the channel 14 can have a rectangular cross section, which is easier to produce by micromachining, and at least one dimension that is approximately equal to or less than the mean free path of the gas molecules under the conditions present in the channel 14.

To generate the pumping effect, the means for creating and maintaining a temperature difference between the successive chambers can include an electrical resistance 17 for heating the gases in the second chamber 13. The electrical resistance 17 can advantageously be disposed near the inlet of the second chamber 13 and fed by control and regulation means.

Alternatively, the means for creating and maintaining a temperature difference can include Peltier-effect junctions located near the inlets of the successive chambers 12 and 13, for example.

The substrate in which the chambers 12 and 13 and the channels 14 are formed is preferably made of a semiconductor material such as silicon, silica, gallium arsenide or silicon carbide.

For ease of manufacture, channels of rectangular cross section may be preferred, in which one dimension, such as the width, is approximately equal to or less than the mean free path of the molecules.

The gases pumped out of the individual enclosure 1 pass through a plurality of stages within the array of micropumps 5. Because the mean free path of the molecules decreases as the gas pressure increases, the chambers and the channels can be made smaller as the gas pressure increases. The typical dimensions used in thermal transpiration micropumps of the above kind are from a few hundreds of microns to less than one micron.

To avoid the more complex production of chambers and channels with very small dimensions when the pressure of the gas to be exhausted is approaching atmospheric pressure, an array of micropumps 5 can advantageously comprise in series at least one primary stage of thermal transpiration effect micropumps and at least one secondary stage of piezo-electric micropumps.

Figure 3:
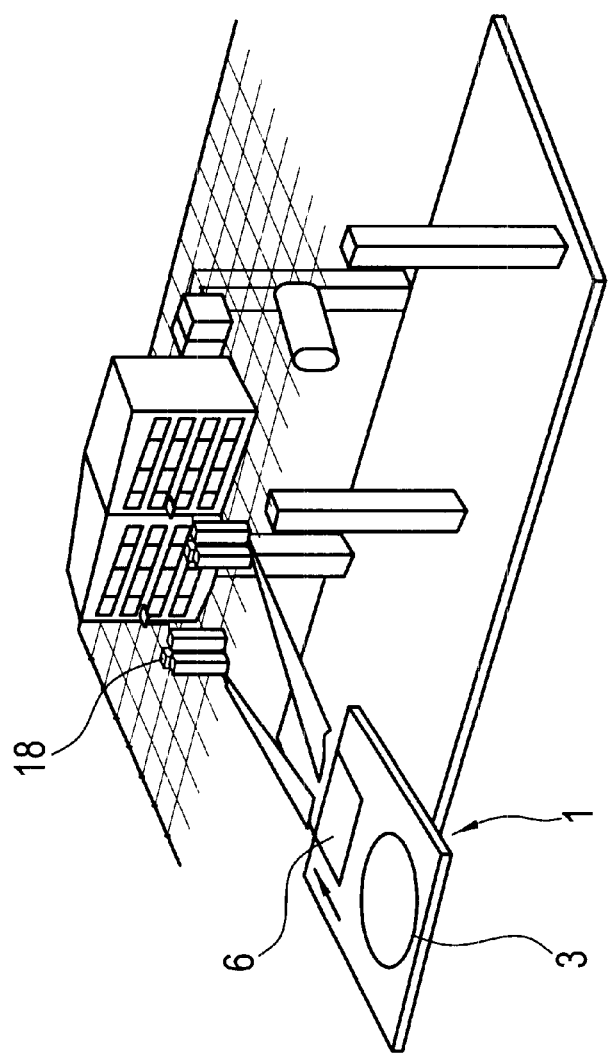
FIG. 3 shows the use of a portable implementation of an atmosphere control device in accordance with the invention for fabricating semiconductors.

FIG. 3 shows one use of the device according to the invention.

In this use, the individual enclosure 1 shown is in the form of a flat parallelepiped-shaped box. The figure also shows the sample 3 and a door device 6. The individual enclosure 1 can be the size of a cassette, depending on the size of the sample 3, for example it can have a diameter from approximately 200 mm to approximately 500 mm and a thickness from approximately 30 mm to approximately 50 mm.

The individual enclosure 1 containing the sample 3 can easily be moved manually to a workstation 18 in which the sample 3 is extracted from the individual enclosure 1 but remains at a pressure similar to that in the individual enclosure 1, for example for a vacuum deposition or etching step of the fabrication of a semiconductor.

Another example of a use of the device according to the invention is the encapsulation of a satellite onboard optical system detector to protect it from moisture and other contaminating agents during dedicated control tests prior to launch.

The present invention is not limited to the embodiments explicitly described but includes variants and generalizations thereof that will be evident to the skilled person.

There is claimed:

1. A method of testing or of transforming semiconductor substrate wafers by etching and deposition, comprising a step of:
   transporting each of the semiconductor substrate wafers individually in a controlled vacuum in an individual enclosure having a diameter of 200 mm to 500 mm and a thickness of 30 mm to 50 mm, with an array of micropumps fastened to said individual disclosure and configured to generate and maintain a controlled vacuum in said individual enclosure.

2. A device for controlling an external atmosphere which surrounds a semiconductor substrate wafer, comprising:
   a sealed individual enclosure that contains said semiconductor substrate wafer and isolates said semiconductor substrate wafer from the external atmosphere, said sealed individual enclosure having a diameter of 200 mm to 500 mm and a thickness of 30 mm to 50 mm to substantially minimize an interior atmosphere around said semiconductor substrate wafer;
   an array of micropumps, that is fastened to said sealed individual enclosure and generates and maintains a controlled vacuum in said sealed individual enclosure, said array of micropumps coupled to an electrical power supply, and
   a means for introducing said semiconductor substrate wafer into said individual enclosure and extracting said semiconductor substrate wafer therefrom.

3. A device for controlling an external atmosphere which surrounds a sample, comprising:
   a sealed individual enclosure that contains said sample and isolates said sample from the external atmosphere;
   an array of micropumps, that is fastened to said sealed individual enclosure and generates and maintains a controlled vacuum in said sealed individual enclosure, said array of micropumps being adapted to be connected to an electrical power supply; and
   a means for introducing said sample into said individual enclosure and extracting it therefrom, wherein said individual enclosure and said array of micropumps jointly comprise a portable self-contained system having an internal electrical power supply for supplying power at least temporarily coupled to said array of micropumps.

4. The device claimed in claim 2, wherein said individual enclosure and said array of micropumps are jointly fixed and constitute a transfer chamber in a semiconductor fabrication installation.

5. The device claimed in claim 2 wherein said array of micropumps comprises thermal transpiration micropumps.

6. The device claimed in claim 5, wherein said array of micropumps comprises:
   a succession of chambers linked by channels of which at least one transverse dimension is equal to or less than a mean free path of gas molecules present in said array of micropumps; and
   means for creating and maintaining a temperature difference between said succession of chambers in order to generate a pumping effect.

7. The device claimed in claim 6, wherein said means for creating and maintaining a temperature difference between said succession of chambers comprises an electrical resistance in a vicinity of an inlet of a second of two successive chambers.

8. The device claimed in claim 6, wherein said means for creating and maintaining a temperature difference comprise Peltier-effect junctions accommodated in a vicinity of respective inlets of the succession of chambers.

9. The device claimed in claim 2 wherein said array of micropumps comprises micromembrane micropumps.

10. The device claimed in claim 2 wherein said array of micropumps comprises piezo-electric micropumps.

11. The device claimed in claim 2 wherein said array of micropumps comprises a series of at least one primary stage of thermal transpiration micropumps and at least one secondary stage of piezo-electric micropumps.

12. The device in claim 2, further including:
   a temperature microsensor, a pressure microsensor and a gas analyzer, for controlling said atmosphere in said sealed individual enclosure and for controlling said array of micropumps via an onboard microcomputer.

13. A device for controlling an external atmosphere surrounding a semiconductor substrate wafer, comprising:
   a sealed individual enclosure that isolates said semiconductor substrate wafer from the atmosphere, comprising,
   said semiconductor substrate wafer, and
   a mini-environment around said semiconductor substrate wafer having a diameter and a thickness substantially proportional to said semiconductor substrate wafer;
   an array of micropumps that generate and maintain a controlled vacuum in said sealed individual enclosure, coupled to an electrical power supply and fastened to said sealed individual enclosure; and
   a means for (a) introducing said semiconductor substrate wafer into said sealed individual enclosure and (b) extracting said semiconductor substrate wafer from said sealed individual enclosure.

14. The device of claim 3, wherein said array of micropumps comprises thermal transpiration micropumps.

15. The device of claim 3, wherein said array of micropumps comprises micromembrane micropumps.

16. The device of claim 3, wherein said array of micropumps comprises piezoelectric micropumps.

* * * * *